US010134483B2

(12) United States Patent
Varadarajan et al.

(10) Patent No.: US 10,134,483 B2
(45) Date of Patent: Nov. 20, 2018

(54) CENTRALIZED BUILT-IN SOFT-REPAIR ARCHITECTURE FOR INTEGRATED CIRCUITS WITH EMBEDDED MEMORIES

(71) Applicant: Texas Instruments Incorporated, Dallas, TX (US)

(72) Inventors: Devanathan Varadarajan, Plano, TX (US); Sumant Dinkar Kale, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 232 days.

(21) Appl. No.: 15/275,694

(22) Filed: Sep. 26, 2016

(65) Prior Publication Data

US 2017/0184662 A1  Jun. 29, 2017

Related U.S. Application Data

(60) Provisional application No. 62/272,518, filed on Dec. 29, 2015.

(51) Int. Cl.
| | |
|---|---|
| *G11C 29/44* | (2006.01) |
| *G11C 29/12* | (2006.01) |
| *G06F 11/20* | (2006.01) |
| *G11C 29/00* | (2006.01) |
| *G01R 31/28* | (2006.01) |

(52) U.S. Cl.
CPC ...... *G11C 29/4401* (2013.01); *G06F 11/2017* (2013.01); *G11C 29/12* (2013.01); *G11C 29/44* (2013.01); *G11C 29/70* (2013.01); *G11C 29/702* (2013.01); *G11C 29/72* (2013.01); *G11C 29/787* (2013.01); *G11C 29/838* (2013.01); *G01R 31/2851* (2013.01)

(58) Field of Classification Search
None
See application file for complete search history.

(56) References Cited

U.S. PATENT DOCUMENTS

| | | |
|---|---|---|
| 7,188,274 B2 | 3/2007 | Nadeau-Dostie et al. |
| 7,415,641 B1 | 8/2008 | Behera et al. |
| | (Continued) | |

OTHER PUBLICATIONS

R. Tekumalla and P. Krishnamoorthy, "Local Repair Signature Handling for Repairable Memories," 2014 IEEE 23rd North Atlantic Test Workshop, Johnson City, NY, 2014, pp. 1-5.*

(Continued)

*Primary Examiner* — Cynthia Britt
(74) *Attorney, Agent, or Firm* — Kenneth Liu; Charles A. Brill; Frank D. Cimino

(57) ABSTRACT

A large-scale integrated circuit with built-in self-repair (BISR) circuitry for enabling redundancy repair for embedded memories in each of a plurality of processor cores with embedded built-in self-test (BIST) circuitry. The BISR circuitry receives and decodes BIST data from the embedded memories into fail signature data in a physical-aware form on which repair analysis can be performed. The fail signature data is reformatted into a unified repair format, such that a fuse encoder circuit can be used to encode fuse patterns in that unified repair format for a repair entity for each of the embedded memories. The fuse patterns are reconfigured into the appropriate order for storing in shadow fuse registers associated with the specific embedded memories.

17 Claims, 11 Drawing Sheets

(56) References Cited

U.S. PATENT DOCUMENTS

| | | | |
|---|---|---|---|
| 7,437,626 B2 | 10/2008 | Chang et al. | |
| 7,788,551 B2 | 8/2010 | Behera et al. | |
| 7,793,173 B2 | 9/2010 | Chang et al. | |
| 8,273,610 B2* | 9/2012 | Or-Bach | H01L 21/6835 438/142 |
| 8,775,997 B2* | 7/2014 | Diamond | G06F 11/267 716/116 |
| 9,318,222 B2 | 4/2016 | Varadarajan et al. | |
| 2009/0172486 A1* | 7/2009 | Ross | G11C 29/1201 714/729 |
| 2011/0029813 A1* | 2/2011 | Gunderson | G06F 11/27 714/30 |
| 2015/0128001 A1* | 5/2015 | Raina | G01R 31/3177 714/726 |
| 2017/0062067 A1* | 3/2017 | Yang | G11C 16/10 |

OTHER PUBLICATIONS

V. R. Devanathan and S. Kale, "A reconfigurable built-in memory self-repair architecture for heterogeneous cores with embedded BIST datapath," 2016 IEEE International Test Conference (ITC), Fort Worth, TX, 2016, pp. 1-6.*

C. Lee, W. Kang, D. Cho and S. Kang, "A New Fuse Architecture and a New Post-Share Redundancy Scheme for Yield Enhancement in 3-D-Stacked Memories," in IEEE Transactions on Computer-Aided Design of Integrated Circuits and Systems, vol. 33, No. 5, pp. 786-797, May 2014.*

Zorian et al., "Embedded-Memory Test and Repair: Infrastructure IP for SoC Yield", IEEE Design & Test of Computers (May-Jun. 2003), pp. 58-66.

Tseng et al., "A Reconfigurable Built-In Self-Repair Scheme for Multiple Repairable RAMs in SOCs", International Test Conference, Paper 30.2 (IEEE, 2006), pp. 1-9.

Tseng et al., "ReBISR: A Reconfigurable Built-In Self-Repair Scheme for Random Access Memories in SOCs", Trans. on Very Large Scale Integration (VLSI) Systems, vol. 18, No. 6 (IEEE, Jun. 2010), pp. 921-932.

Devanathan et al., "Physical-aware Memory BIST Datapath Synthesis: Architecture and Case-studies on Complex SoCs", 2011 Asian Test Symposium (IEEE Computer Society, 2011), pp. 457-458.

Hou et al., "High Repair-Efficiency BISR Scheme for RAMs by Reusing Bitmap for Bit Redundancy", Trans. on Very Large Scale Integration (VLSI) Systems, vol. 23, No. 9 (IEEE, Sep. 2015), pp. 1720-1728.

Sridhar et al., Built-in self-repair (BISR) technique widely Used to repair embedded random access memories (RAMs), Int. J. of Computer Sci. Engineering (IJSCE), vol. 1, No. 1 (Sep. 2012), pp. 42-60.

"Memory Repair Primer : A Guide to Understanding Embedded Memory Repair Options and Issues" (LogicVision, Apr. 2007).

"Embedded Memory Self-Test, Repair, and Debug: Tessent MemoryBIST", Datasheet (Mentor Graphics, 2015).

"DesignWare STAR Memory System" Datasheet (Synopsys, Inc., 2015).

* cited by examiner

CENTRALIZED BUILT-IN SOFT-REPAIR ARCHITECTURE FOR INTEGRATED CIRCUITS WITH EMBEDDED MEMORIES

CROSS-REFERENCE TO RELATED APPLICATIONS

This application claims priority, under 35 U.S.C. § 119(e), of Provisional Application No. 62/272,518, filed Dec. 29, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of the test and configuration of large scale integrated circuits. Embodiments are more specifically directed to an architecture for invoking redundant memory elements.

Many modern electronic integrated circuits integrate essentially all necessary functional components of a computer system, whether general purpose or arranged for a particular end application. Those large scale integrated circuits that include the computational capability for controlling and managing a wide range of functions and useful applications are often referred to as "system on a chip", or "SoC", devices. Typical modern SoC architectures include one or more processor cores that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the SoC for acquiring and outputting the data processed by the processor cores. In any case, considering the large amount of digital data often involved in performing the complex functions of these modern devices, significant solid-state memory capacity, including both volatile and non-volatile memory, is now commonly implemented in these SoC devices.

To optimize performance, memory resources are typically distributed throughout the typical modern SoC device. This distributed memory architecture results in memory resources being physically (or logically) proximate to the processing function that will be accessing it. For example, the deployment of local memory resources will minimize the traffic over the system bus, which reduces the likelihood of bus contention and undesirable latency, and also reduces access time and memory management overhead. In many instances, these embedded memories are not accessible over the system bus, but are only available to the processor circuitry in which it is realized.

As known in the art, SoC devices typically include internal test circuitry ("built-in self-test", or "BIST", circuitry) that executes a self-test operation for the device upon power-up or reset. BIST may also be involved in the testing of memory, both at the time of manufacture and also on power-up, and is especially useful for testing those embedded memories that are not accessible over the system buses of the SoC device. Some conventional BIST memory test techniques include the placement of hardwired logic in the SoC, by way of which memory test algorithms developed at the time of circuit design are implemented; however, it may not be feasible to determine the particular tests to be performed at that early stage of the process. Programmable BIST ("pBIST") techniques have been developed to test embedded memories in the SoC context. For example, the SoC may include a general purpose test controller that is programmed by a set of instructions to produce test conditions for the various internal and embedded functions of the device, and to receive and log the responses of those functions to those test conditions. In the memory test context, these operations include the writing of the desired data pattern to an embedded memory, and then addressing the memory to retrieve and compare the stored data to the expected data. Typically, the BIST data path over which the data are communicated during memory test is a separate and independent data path from that by which the embedded memories are accessed in normal operation of the SoC.

In many of these modern SoC devices, embedded memory resources occupy the majority of the chip area of the SoC device, in some cases as much as 70% of the total chip area. Because of this predominance of the overall chip area, manufacturers will tend to use the most advanced transistor technology, and thus the minimum available feature sizes, in the memory arrays of the SoC device. As known in the art, the smaller the feature size of a transistor, the smaller is the size of a "killing" defect that can cause its failure. Accordingly, a large portion of the chip area in the SoC will also be the most vulnerable to manufacturing defects.

Accordingly, most memory arrays in modern large scale integrated circuits include some type of redundancy. In general, memory redundancy allows the replacement of failed memory cells with spare memory cells, typically by reconfiguring the address decoding circuitry for the array. For example, a memory array may be constructed to have one or more "repair entities", such as one or more spare rows, one or more spare columns, or some combination of spare rows and columns. These spare memory cells will not be involved in the storing of data if all of the main memory cells are properly functioning, but are available to be mapped into the memory address space in place of failed cells in the main memory array.

In the embedded memory context, built-in self-repair (BISR) capability has become common in many modern large scale integrated circuits. In a general sense, BISR circuitry constitutes an interface between the BIST data path and the redundancy logic, in that it determines whether repair is necessary based on the results of the BIST routines, and if so, determines the mapping of the repair entities in place of the failed cells. In this regard, the BISR circuitry of an integrated circuit typically includes built-in repair analysis (BIRA) logic that receives the failure information for each repairable memory from the BIST circuitry, and that allocates the repair entities for those memories, typically according to a redundancy analysis algorithm. The redundancy allocation is then forwarded to fuse controller circuitry, for configuration of the "fuses" according to the allocation.

Various types of "fuses" may be used to configure the memory redundancy based on the BIST and other test results. According to "hard" repair techniques, permanent fuses (e.g., laser-blown or electrically-blown metal or semiconductor fuses) or one-time-programmable (OTP) non-volatile memory cells are blown or programmed, as the case may be, to permanently store the redundancy repair information in a type of read-only memory (i.e., the "fuse ROM"). For "soft" redundancy repair, the redundancy "fuses" are banks of flip-flops that are loaded with the reconfiguration information based on the desired allocation.

Of course, these flip-flops must be loaded each time that the SoC is powered up. In "firm" repair, electrically erasable non-volatile memory cells store the reconfiguration information, but can be erased if it becomes necessary to reconfigure the repair entities. Given these techniques, hard repair is best-suited for configuring memory redundancy at manufacturing test, but generally cannot be invoked for repairing later-life failed bits. Conversely, soft repair can be used at the time of manufacture and also over the device life, but requires complete testing of the memories, and repeating of the memory test following the loading of the repair configuration, each time that the device is powered up. Hybrid schemes are also known, in which both hard and soft repair is applied, with the hard repair performed at manufacturing test and the soft repair used during later life of the device. For example, at manufacturing test, soft repair information acquired via BISR analysis may be used to set the state of hard repair fuses. These repairs will be transparent in subsequent BIST/BISR each time the device is powered up, with soft repair applied to only the additional memory cells that fail over the operating life of the device.

Continuing improvements in manufacturing technology have enabled the implementation of a wide number and variety of functional units into a single SoC. These functional units are often in the form of a block of programmable or custom logic circuitry, along with embedded memory resources, that is "portable" in the sense that it can be placed in an integrated circuit layout as a whole in order to provide the desired function. These blocks are referred to in the art as processor cores or "intellectual property cores" (or "IPs", for short). It is now not uncommon for multiple processor cores from different vendors and of different functional and BIST architectures to reside within the same large scale integrated circuit. In such modern large-scale SoC devices, the number of memory arrays that are embedded in these processor cores can be quite large, numbering into the hundreds in some cases. One example of a current-day SoC has nineteen processor cores (which included embedded memory) of seven different functional types, from three different sources and thus three different BIST datapath architectures, along with additional peripheral functional units that also include embedded memories. The embedded memory instances can themselves be quite diverse among themselves, with different data word widths, varying redundancy capability, widely different operating frequencies (e.g., from less than 100 MHz to greater than 1 GHz), and differing cell technology. This diversity in embedded memory type and BIST datapath architecture greatly complicates the implementation of BISR to maximize manufacturing yield and maintain reliability of the overall device.

Those SoC devices that include processor cores from different sources or vendors complicate the BISR task. Some vendors of processor core IPs embed BIST circuitry and a BIST datapath entirely within the IP, such that communication with embedded memories in that IP can only be accessed over the functional datapath; no external access to the BIST datapath is provided. However, memory controller functions within these "black box" processor core IPs apply banking and other logical address translation to the embedded memories, such that full control of the addressing and operation of the embedded memories is not available to BIST and BISR circuitry outside of those IPs. In some conventional SoC implementations, BISR is simply not available for memories embedded in these black box processor cores.

Conventional electronic design automation (EDA) solutions apply a brute force approach to implementing BIST/BISR for devices including such IP source diversity. Specifically, these EDA implementations provide dedicated memory test, repair analysis, and repair allocation circuitry for each and every embedded BIST DP processor core interface. The chip area required under this approach can be quite substantial, and thus costly to implement in terms of silicon real estate.

FIG. 1 illustrates a generalized BIST/BISR architecture according to a conventional EDA approach for applying BISR to embedded memory instances of different type within the same processor core IP. In this conventional example, processor core 2 includes embedded memories $M_1$, $M_2$, $M_3$, each of which is accessible to the logic circuitry (not shown) within processor core 2 itself but is not directly accessible from outside of processor core 2. In this example, embedded memories $M_1$, $M_2$, $M_3$ are testable over embedded BIST datapath 4 within processor core 2. The contents of memories $M_1$, $M_2$, $M_3$ resulting from these BIST operations are accessible to circuitry outside of processor core 2 only by way of BIST datapath 4, which is typically at an interface over which processor core 2 communicates its BIST data for resolution by external test circuitry (e.g., external test equipment, BISR circuitry in the embedding integrated circuit, etc.). However, these BIST data are typically encoded and arranged logically according to the bit line architecture of the particular embedded memories, and to the memory banking and logical memory address mapping applied by memory controller functions in processor core 2 (and thus not necessarily visible from outside the IP), rather than physically. As such, these memory data must be decoded and remapped, logically to physically, in order to analyze the failing locations for assignment of redundant repair entities to those failing locations.

According to this conventional EDA architecture, data from each of memories $M_1$, $M_2$, $M_3$ are decoded by an instance of output decode circuitry 8 for memory. In this example, the three memories $M_1$, $M_2$, $M_3$ are each associated with a corresponding instance of multiplexed mapping logic $6_1$, $6_2$, $6_3$ that decodes the BIST data presented by over embedded BIST datapath 4 into a form suitable for analyzing and applying redundancy repair, according to the corresponding data organization, bit line architecture, physical to logical address mapping, banking arrangement, etc. The logical data word width will typically vary among the constituent memories $M_1$, $M_2$, $M_3$; BIST datapath 4 will thus have a logical width to accommodate the widest memory data path. Referring to the output decode instance for memory $M_1$, AND function $5_1$ gates the application of the BIST data from embedded BIST datapath 4 to the corresponding multiplexed mapping logic $6_1$, in response to an identifier signal M1 indicating that memory $M_1$ is the currently-tested memory with its BIST data presented by embedded BIST datapath 4. Multiplexed mapping logic $6_1$ decodes, or maps, these BIST data for memory $M_1$ into the appropriate logical order or format for BISR analysis, and presents that data (of a word width w1 as shown in FIG. 1) to BISR circuitry 8 to determine whether redundancy repair is necessary and, if so, the allocation of repair resources to best address the failed bits. Similarly, memories $M_2$, $M_3$ are each associated with respective instances of this output decode circuitry of AND function $5_2$, $5_3$ and multiplexed mapping logic $6_2$, $6_3$, with the results presented to BISR circuitry 8.

BISR circuitry 8 includes dedicated circuitry for each of memories $M_1$, $M_2$, $M_3$ according to this conventional EDA BIST architecture, as shown in FIG. 1. Referring again to the data path for memory $M_1$, the remapped BIST data presented by multiplexed mapping logic $6_1$ are compared by XOR function $7_1$ with the expected BIST data M1_ED for the corresponding (mapped) addresses and test being performed, to produce fail signature $FD_1$ indicating those bit locations, if any, that failed the BIST routine (i.e., produced data differing from expected data M1_ED). This fail signature $FD_1$ is presented to fuse encode logic $10_1$, which performs built-in repair analysis (BIRA) to determine whether redundancy repair is necessary and, if so, allocates the repair entities available at memory $M_1$ to address those bit failures, and encodes the fuse pattern appropriate to invoke that allocation. The fuse encoding produced by fuse encode logic $10_1$ is then applied to shadow fuse registers $12_1$, which are typically flip-flops that contain the "soft" redundancy information (i.e., repair mapping) to be used in the accessing of memory $M_1$. If "firm" or "hard" repair is to be implemented, the contents of shadow fuse registers $12_1$ are applied to the appropriate fuse programming circuitry for programming into the fuse ROM for memory $M_1$. Again, each of the other memories $M_2$, $M_3$ are provided with their own dedicated instances of BISR circuitry 8 according to this conventional architecture, each such instance including a corresponding XOR function $7_x$, fuse encode logic $1_x$, and shadow fuse registers $12_x$.

While this conventional EDA architecture is capable of implementing BISR for embedded memories of various architectures, each embedded memory is provided with its own dedicated BISR circuitry for performing the redundancy repair analysis from the fail signature of that memory and for encoding the fuse pattern because of variations among the architectures of those memories. Especially in SoC devices with diverse processor cores (i.e., some including embedded BIST circuitry), this approach is very area intensive, and thus costly to implement in modern large scale integrated circuits. Considering that many modern SoC devices include hundreds of embedded memories, the chip area overhead necessary for self-test and self-repair logic can be massive, in some cases requiring as many as one million logic gates. This overhead will appear especially costly for mature devices, since the utilization of the available fuses in the fuse ROM will be relatively low for high-yield devices, yet the BISR circuitry must yet be present.

BRIEF SUMMARY OF THE INVENTION

Disclosed embodiments provide built-in self-repair circuitry and a method of operating the same that can be efficiently realized in a large-scale integrated circuit.

Disclosed embodiments provide such circuitry and method suitable for integrated circuits having diverse functional units with embedded memories.

Disclosed embodiments provide such circuitry and method that reduces the test time required for executing built-in self-repair.

Disclosed embodiments provide such circuitry and method that reduces power consumption in the built-in self-repair circuitry during normal operation.

Other objects and advantages of the disclosed embodiments will be apparent to those of ordinary skill in the art having reference to the following specification together with its drawings.

According to certain embodiments, built-in self-repair (BISR) circuitry for an integrated circuit includes an interface for receiving memory data from a processor core having multiple embedded memories. Output decode circuitry generates fail signature data for one of the embedded memories under test corresponding to a comparison between its output data and expected data, and arranges these data into a physical-aware format for the memory. Align and merge circuitry aligns and merges the fail signature data into a unified repair format common to all memories of the processor core. A fuse encoder encodes the fail signature data into a fuse pattern according to the desired redundancy repair. Reconfiguration circuitry reorders the fuse pattern from the unified format into the appropriate order for the corresponding memory, and loads the reordered fuse pattern into a shadow fuse register block for that memory.

DETAILED DESCRIPTION OF THE INVENTION

The one or more embodiments described in this specification are implemented into a multiple-core large-scale integrated circuit, such as that suitable as a system-on-a-chip (SoC) or similar device, as it is contemplated that such implementation is particularly advantageous in that context. However, it is also contemplated that concepts of this invention may be beneficially applied to other applications, including general purpose microprocessors, application specific processors, and the like. Accordingly, it is to be understood that the following description is provided by way of example only, and is not intended to limit the true scope of this invention as claimed.

Figure 1:
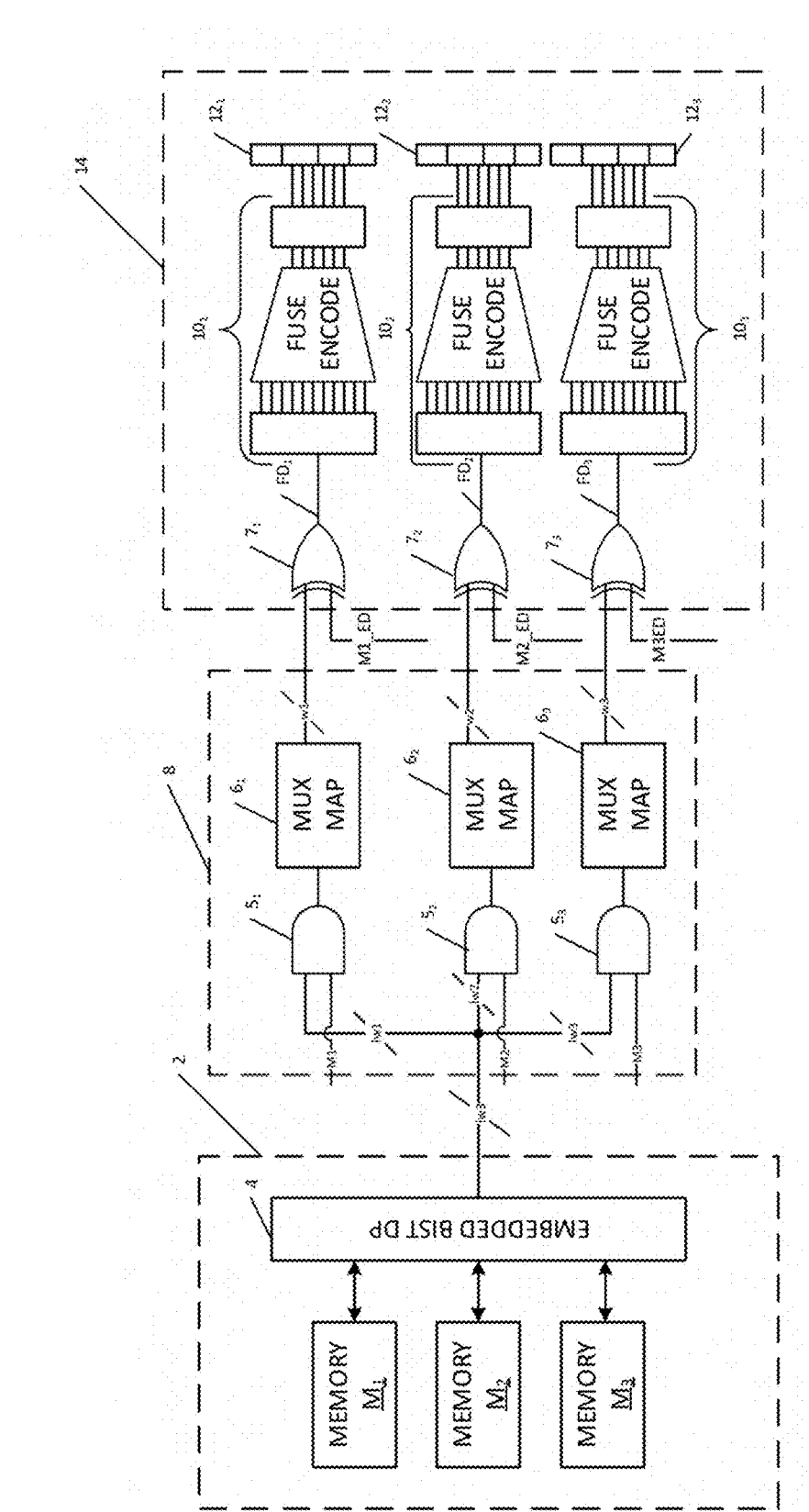
FIG. 1 is an electrical diagram, in block form, of a conventional built-in self-repair architecture in an integrated circuit.
Figure 2:
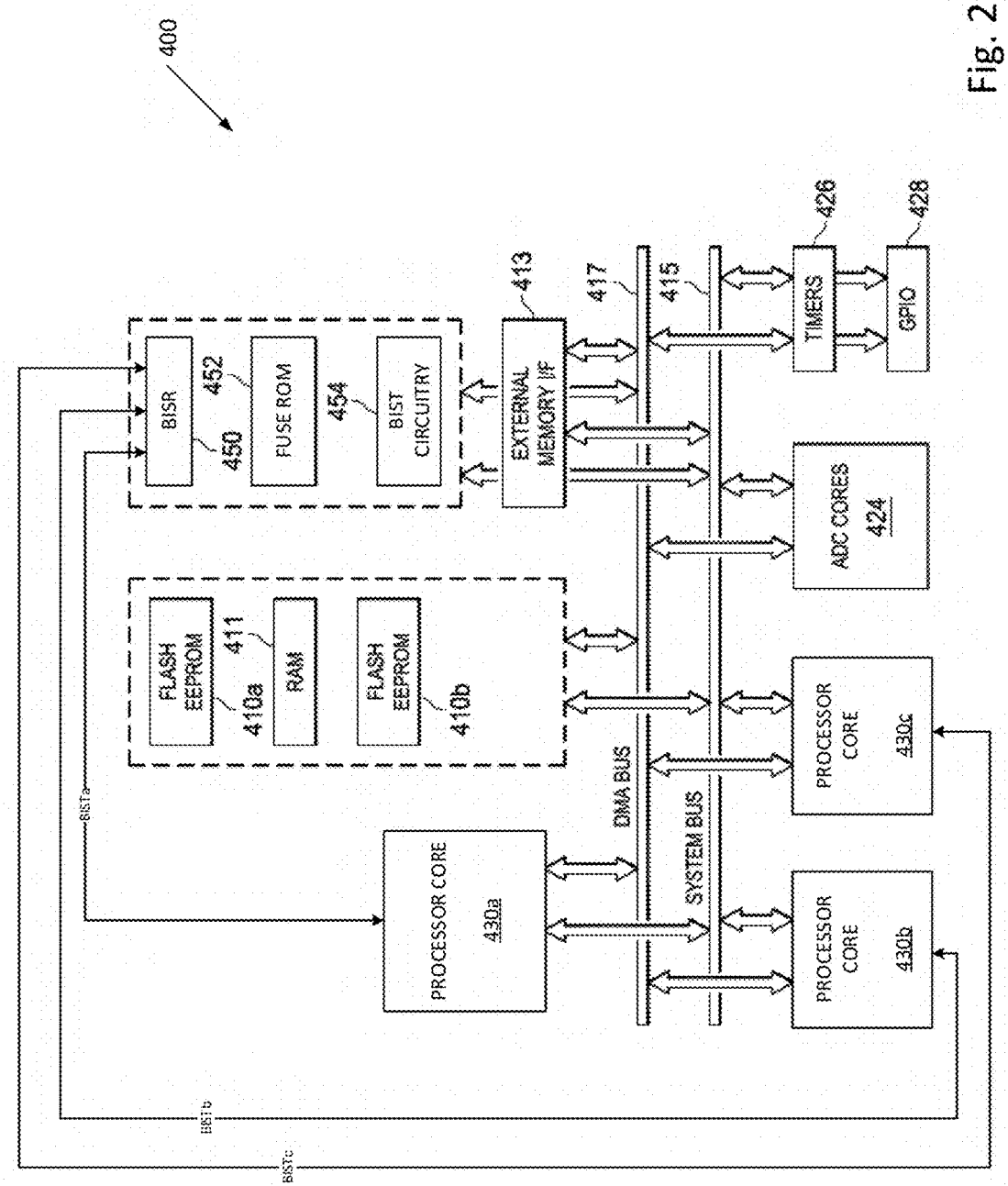
FIG. 2 is an electrical diagram, in block form, of a "system-on-a-chip" (SoC) integrated circuit device constructed according to embodiments.

FIG. 2 illustrates, in block diagram form, the generalized architecture of an example of SoC 400 constructed according to these embodiments. In this example, SoC 400 as shown in FIG. 2 follows the generalized architecture of a modern system-on-a-chip such as in the TDAxx and DRAx families of processors available from Texas Instruments Incorporated. Those skilled in the art having reference to this specification will recognize that SoC 400 may include additional or alternative functions beyond those shown in FIG. 2, or may have its functions arranged according to a different architecture from that shown in FIG. 2.

SoC 400 includes multiple processor cores 430*a*, 430*b*, 430*c*, etc. that carry out various programmable arithmetic and logic functions as appropriate for the end application of SoC 400. Examples of the various types of processor cores 430 include generic programmable processors, digital signal processors (DSPs) or other application-specific or customized logic, fixed sequence generators, and the like. For purposes of this description, these processor cores 430 each constitute a block of programmable or custom logic circuitry in combination with embedded memory resources. As typical in the art, these processor cores 430 are "portable" in the sense that each can be placed, as a whole, in an integrated circuit layout for providing a particular desired function, and are "reusable" in the sense that the same processor core may be used in different overall SoC architectures. The particular form in which a given processor core 430*x* is defined can also vary; "soft" cores are in the form of synthesizable data according to a hardware description language or gate-level "netlist", while "hard" cores are defined as a low-level physical description or actual integrated circuit layout. Processor cores 430 are also referred to in the art as "intellectual property cores", "IP cores", or more simply "IPs", and are often distributed under license agreements with the owner of the intellectual property rights in the design. As described above in connection with the Background of the Invention, processor cores 430*a*, 430*b*, 430*c* in SoC 400 need not originate from the same source or vendor; rather, it is not uncommon for multiple processor cores, from different vendors and of different functional and BIST architectures, to reside within the same large scale integrated circuit.

According to this embodiment, the embedded memory resources of processor cores 430*a*, 430*b*, 430*c* of SoC 400 may be realized as random access memory (RAM) for data storage, flash or other non-volatile memory for storage of data or program instructions, or a combination of these memory types. As discussed above, these embedded memory resources may not be directly accessible over the functional datapath (e.g., via system bus 415) but may be testable only by embedded BIST circuitry and communicated only via a corresponding BIST datapath of processor core 430.

Other memory resources may also reside in SoC 400, for example as shown by non-volatile memory arrays 410*a*, 410*b* and RAM 411, each of which is accessible over system bus 415 or direct memory access (DMA) bus 417. While memory resources 410*a*, 410*b*, 411 are shown in FIG. 2 as unitary blocks, these memory resources may alternatively be realized as multiple memory blocks or arrays. Various memory cell types and arrangements may be used to implement these memory resources 410*a*, 410*b*, 411. For example, RAM 411 may be realized by static RAM (SRAM), dynamic RAM (DRAM), or the like, and non-volatile memories 410*a*, 410*b* may be realized as flash memory (as shown in FIG. 2), non-flash EEPROM memory, mask-programmable read-only memory (ROM), one-time-programmable (OTP) ROM, and the like. In addition, it is contemplated that individual instances of memory resources may have any one of a number of access architectures, including single-port and multi-port access for RAM 411.

Various peripheral functions may also be provided in SoC 400. In the architecture of FIG. 2, these peripherals include analog-to-digital converter (ADC) cores 424, timers 426, and general purpose input/output (GPIO) interface 428, each of which is coupled to system bus 415 and DMA bus 417 so as to be accessible to processor cores 430*a*, 430*b*, 430*c* and to one another. Other peripherals such as serial interfaces, network interfaces, various signal processing functions, and the like may also be included in SoC 400. SoC 400 also includes other functions such as external memory interface 413, power and clock circuitry, and other conventional support functions as known in the art.

In a more general sense, it is contemplated that the various memory resources and other functions in the architecture of SoC 400 may not be physically realized in the arrangement shown in FIG. 2, but may instead be placed at various locations within the integrated circuit. In this regard, multiple instances of those memory resources and other functions may in fact be physically (and logically, for that matter) distributed throughout SoC 400. These and other variations in the arrangement of SoC 400 that will be apparent to those skilled in the art having reference to this specification are contemplated to be within the scope of this disclosure.

According to these embodiments, SoC 400 includes built-in self-repair (BISR) circuitry 450 and fuse ROM 452. As shown in FIG. 2, BISR circuitry 450 is coupled to processor cores 430*a*, 430*b*, 430*c* via BIST datapaths BISTa, BISTb, BISTc, respectively. These BIST datapaths BISTa, BISTb, BISTc correspond to the conventional BIST interfaces over which processor cores 430*a*, 430*b*, 430*c* respectively export BIST data to BIST or other test circuitry. In these embodiments, BISR circuitry 450 receives data over these BIST datapaths resulting from the execution of self-test program routines as carried out by and within processor cores 430*a*, 430*b*, 430*c* themselves, for example upon power-up of SoC 400.

In addition, conventional BIST circuitry 454 may be provided in SoC 400, as shown in FIG. 2. BIST circuitry 454 is provided to initiate and evaluate self-test routines for circuitry outside of those functions that include their own embedded BIST function (i.e., other than processor cores 430*a*, 430*b*, 430*c* in this example), typically at power-up of SoC 400. BISR circuitry 450 according to these embodiments may also receive data corresponding to the contents of non-embedded SoC memories 410*a*, 410*b*, 411, such data including, for example, the results of routines executed by BIST circuitry 454 or test algorithms applied by external automated test equipment. Additionally or in the alternative, it is contemplated that BISR circuitry 450 may have an external interface so as to receive commands and expected data from automated test equipment (not shown), and to communicate test results in response.

According to these embodiments, BISR circuitry 450 is constructed to include a unified repair architecture for performing repair analysis for embedded memories, and perhaps also non-embedded memories in SoC 400, despite the architectural diversity among those memories. As will become apparent from the following description, this unified architecture is enabled by the aligning and merging the fail signature data from these diverse memory architectures into an interface that is applied to the unified repair architecture. Repair analysis, as performed under the unified repair architecture on the aligned and merged fail signature data, results in repair data that are reconfigured and encoded for storing in shadow fuses for each of the diverse memories.

Figure 3:
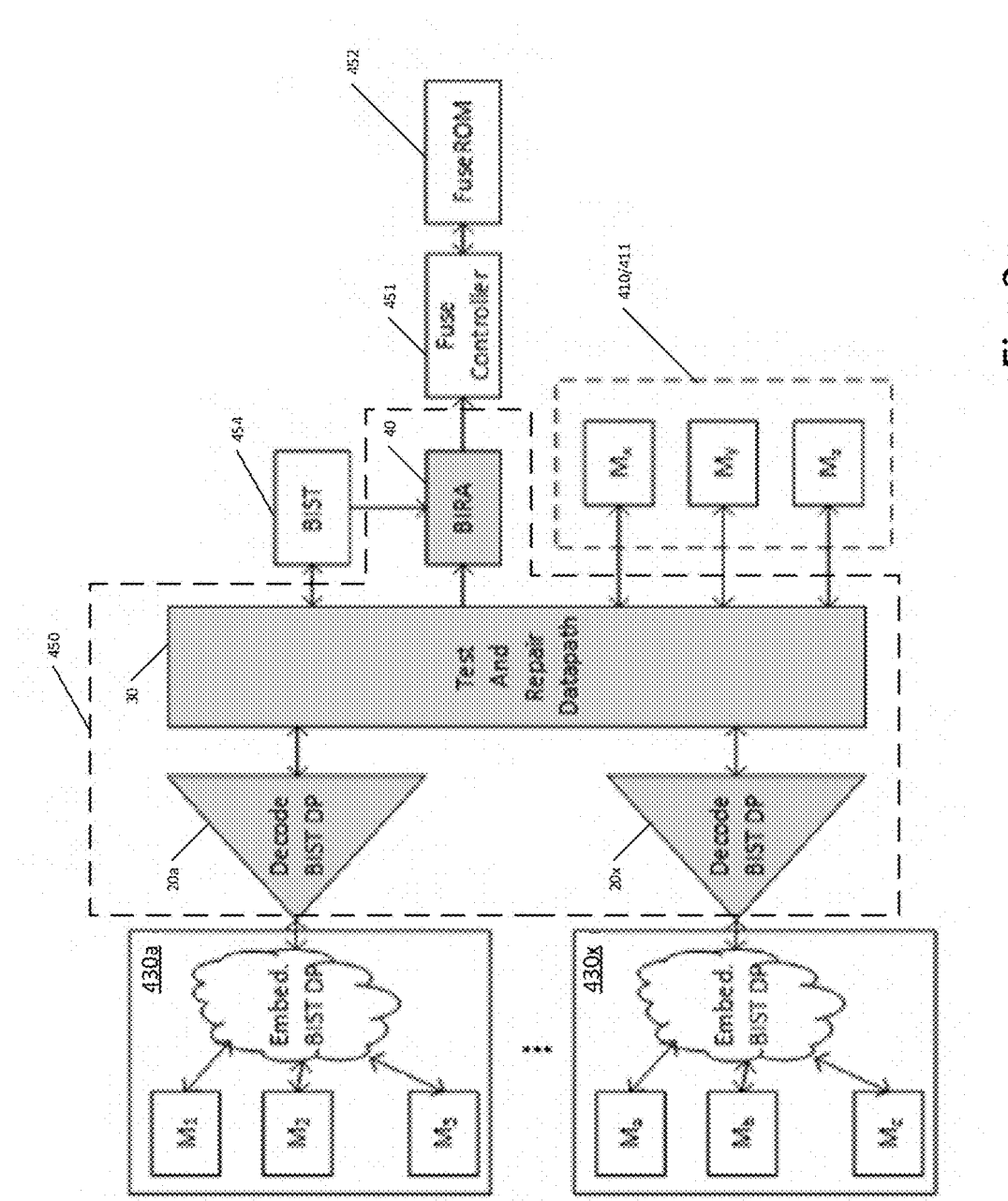
FIG. 3 is an electrical diagram, in block form, of an architecture for built-in self-repair circuitry as applied to multiple processor cores according to an embodiment.

Referring now to FIG. 3, the datapath architecture of SoC 400 including BISR circuitry 450 according to these embodiments will be described. As shown in this FIG. 3, BISR circuitry 450 interfaces with the embedded BIST datapath of each of processor cores 430 (shown as processor cores 430a through 430x in FIG. 3) on its input side. According to these embodiments, decode functions 20a through 20x of BISR circuitry 450 decode the data presented by processor cores 430a through 430x into fail signature data that is arranged for application to unified test and repair datapath 30. As will be described in further detail below, these decoded fail signature data are "physical-aware", in that the data are aligned and merged into a physical format for the corresponding embedded memories, as appropriate for repair analysis. Unified test and repair datapath 30 also interfaces to the non-embedded memories 410, 411, if desired. The decoded fail signature data are then applied by unified test and repair datapath 30 to centralized BIRA circuitry 40. Because of the unified physical-aware arrangement of the fail signature data as applied by datapath 30, centralized BIRA circuitry 40 is operable to analyze and encode the fail signature for embedded (and non-embedded) memories of diverse architectures and banking into repair data applicable to each individual repairable memory. If desired, fuse controller 451 can receive these repair data and program non-volatile fuses in fuse ROM 452 to permanently enable the redundancy repair. Alternatively, "soft repair" may be implemented by retaining the repair data for each memory in "shadow fuses", such as banks of flip-flops for each repairable memory, within BISR circuitry 450.

Figure 4:
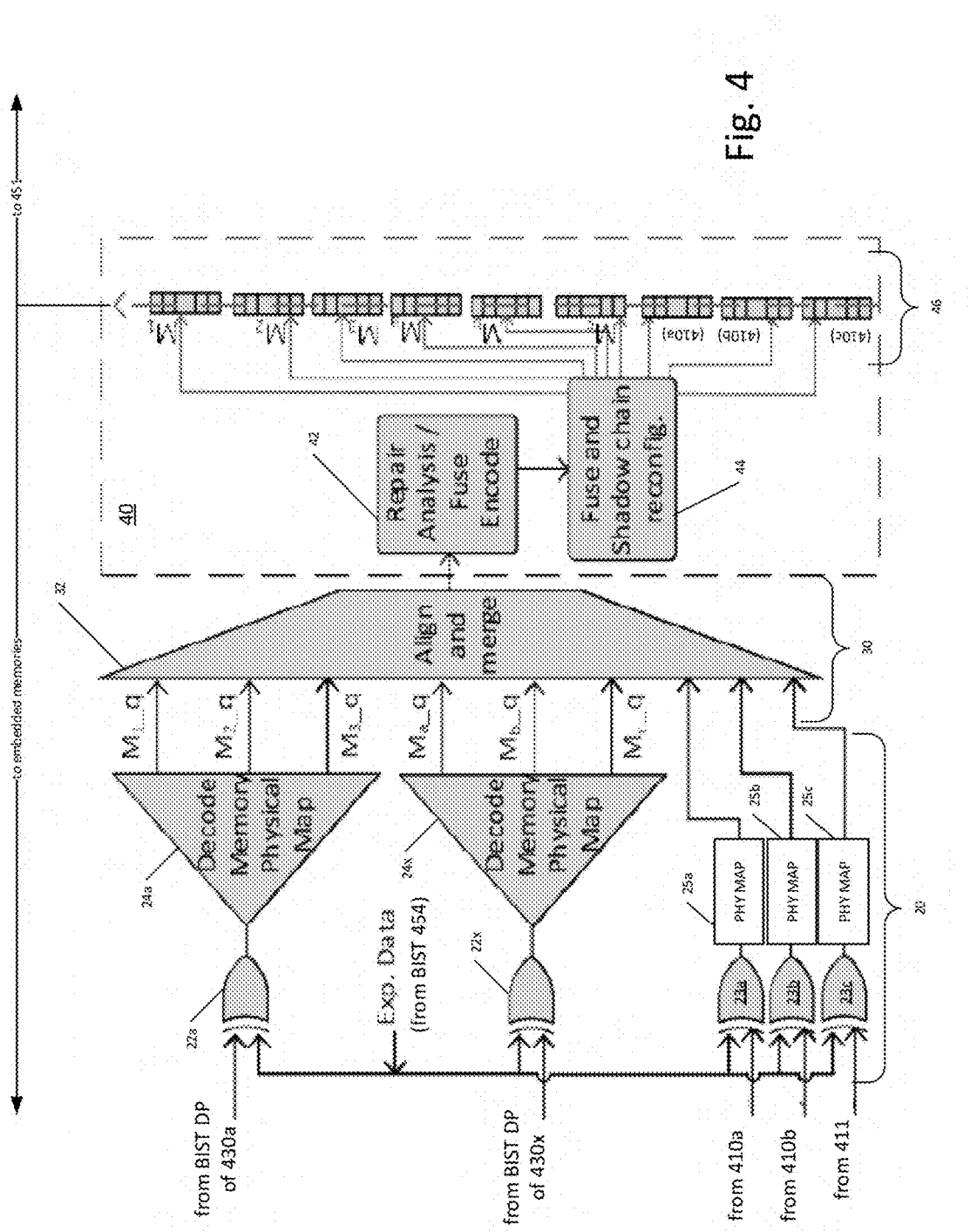
FIG. 4 is an electrical diagram, in block form, of built-in self-repair circuitry for one of the processor cores in the architecture of FIG. 3 according to an embodiment.

FIG. 4 illustrates the functional architecture of BISR circuitry 450 according to these embodiments. In this arrangement, decode functions 20a through 20x in the datapath architecture shown in FIG. 3 include exclusive-OR functions 22a through 22x and decode memory physical map functions 24a through 24x as shown in FIG. 4. The BIST datapath of each of processor cores 430a through 430x is coupled to an input of a corresponding bit-wise exclusive-OR function 22a through 22x, respectively, for comparison of the contents of the one of the embedded memories under test with the corresponding expected data for that test, for example as presented by the BIST circuitry of the corresponding processor core 430, or by BIST circuitry 454. The outputs of exclusive-OR functions 22a through 22x present the fail signature for the particular memory under test in each processor core 430a through 430x, on a common data bus for all of the embedded memories. These fail signature data are applied to a corresponding decode memory physical map function 24a through 24x.

Decode memory physical map functions 24a through 24x decode the fail signature data provided at the common output of the corresponding exclusive-OR function 22a through 22x according to which embedded memory is under test, to separately present per-memory fail signature data. Decode memory physical map functions 24a through 24x also decode that fail signature data from a form according to the logical address architecture for the particular embedded memory, to a physical-aware form upon which repair analysis can be performed for each memory. In other words, the per-memory physical-aware fail signature data presented by functions 24a through 24x present those data according to a physical view corresponding to the physical repair architecture of the particular embedded memory. For example, decode memory physical map function 24a presents three separate outputs $M_1\_q$, $M_2\_q$, $M_3\_q$, respectively corresponding to embedded memories $M_1$, $M_2$, $M_3$ of processor core 430a. These separate outputs from decode memory physical map function 24a reflect that the logical-to-physical mapping and fail signature decoding may differ among the various embedded memories in a given processor core 430. For example, if embedded memory $M_1$ has only redundant columns, the fail signature data on output $M_1\_q$ will include only the column fail signature; if, for example, embedded memory $M_2$ has redundant rows and columns, its fail signature data on output $M_2\_q$ will include both row and column fail signatures. As such, the functional architecture of BISR circuitry 450 according to these embodiments can efficiently comprehend these differences in physical, logical, and repair architectures, even among embedded memories within "black box" processor cores.

The BISR architecture of these embodiments is also capable of analyzing and repairing non-embedded memories, such as memories 410a, 410b, 411 in SoC 400 of FIG. 2. Because these memories can be directly controlled, for example by BIST circuitry 454, no decoding of a general purpose datapath is necessary. As such, the outputs of non-embedded memories 410a, 410b, 411 are applied to an input of corresponding exclusive-OR functions 23a, 23b, 23c for comparison with expected data for those memories, for example as provided by BIST circuitry 454. The resulting fail signature is provided by exclusive-OR functions 23a, 23b, 23c to physical map logic functions 25a, 25b, 25c, respectively, which map the fail signature from its logical architecture to a physical-aware mapping, on which repair analysis can be performed.

In the functional architecture shown in FIG. 4, align and merge function 32 receives the per-memory physical-aware fail data from decode functions 24a through 24x for the embedded memories under test, as well as the physical-aware fail data from physical map logic functions 25a through 25c for non-embedded memories 410a, 410b, 411, and aligns and merges these data into a unified format for purposes of repair analysis. As such, align and merge function 32 provides the functional circuitry for arranging the per-memory fail signature data from diverse embedded (and perhaps non-embedded) memories into test and repair datapath 30 of FIG. 3, for applying to the unified repair architecture of BIRA function 40 according to these embodiments.

As shown in FIG. 4, repair analysis and fuse encode circuitry 42 of BIRA function 40 receives the fail signature data for the one or more memories under test from align and merge function 32. Because that fail signature data in a unified format regardless of the architecture of the memories themselves, repair analysis and fuse encode repair analysis and fuse encode function 42 can essentially be shared across multiple memories and across multiple processor cores 430a through 430x, according to these embodiments. As will be described below, function 42 will operate to derive and encode a fuse pattern for the applicable repair entities for each of the memories under test, from the fail signature data for that memory.

The fuse patterns derived by repair analysis and fuse encode function 42 are in the unified repair format, rather than arranged according to the particular architecture of the memories. Accordingly, fuse and shadow chain reconfiguration logic 44 is provided to reconfigure the fuse patterns derived by repair analysis and fuse encode function 42 into the proper order for enabling the desired repair entities for the rows or columns to be replaced in the memories under test. Function 42 then applies the reconfigured fuse pattern to the appropriate shadow fuse registers 46 for the memory under test. As shown in FIG. 4, each of the embedded and non-embedded memories has its own shadow fuse register 46. According to these embodiment, the contents of shadow fuse registers 46 can be scanned out in shift register manner for application to the respective embedded memories of processor cores 430 (e.g., written to registers in those memories that store the row or column addresses to be replaced) to accomplish "soft" repair in the conventional manner. In this case, soft-repair circuitry, such as conventional clock and control circuitry (not shown), will be provided to control the scanning out of the fuse pattern data from shadow fuse registers 46 to the corresponding embedded memories in the conventional manner. Alternatively or in addition, the contents of shadow fuse registers 46 can be scanned out to fuse controller 451 for programming into FuseROM 452 to accomplish "hard" repair in the conventional manner.

Figure 5:
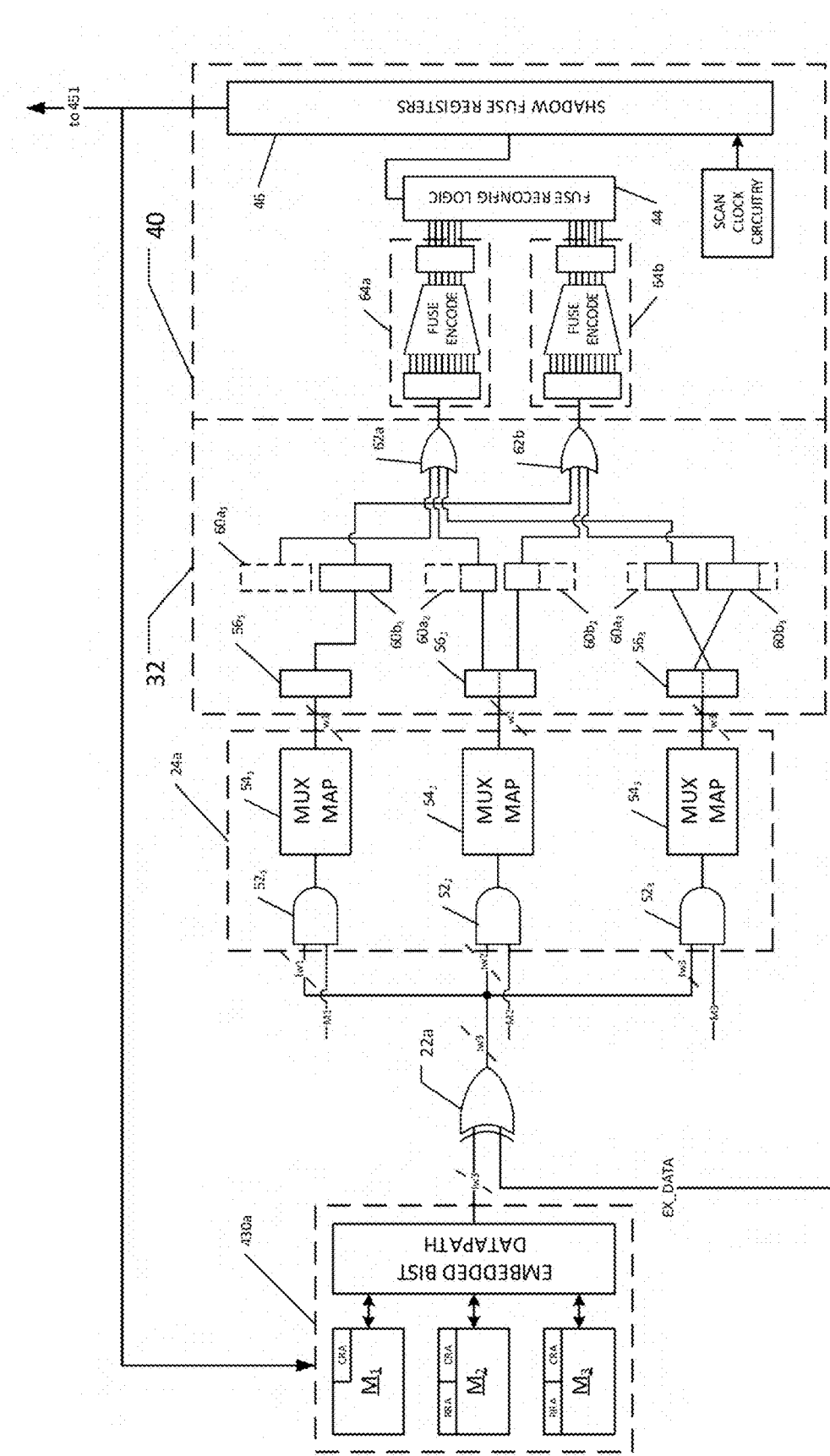
FIG. 5 is an electrical diagram, in block form, of the decode memory physical map and align-and-merge circuitry in the built-in self-repair circuitry of FIG. 4 according to an embodiment.

FIG. 5 shows the construction of a portion of BISR circuitry 450 associated with processor core 430*a* and its embedded memories $M_1$, $M_2$, $M_3$, according to an embodiment. It is contemplated that the portion of BISR circuitry 450 shown in FIG. 5 and described herein will be representative of similar circuitry in BISR circuitry 450 associated with other processor cores 430; in addition, it is contemplated that a portion of BISR circuitry 450 may be shared among multiple processor cores 430.

As shown in both FIGS. 4 and 5, the BIST datapath from processor core 430*a* is applied to an input of exclusive-OR function 22*a*, which receives corresponding expected data as generated by embedded BIST circuitry within processor core 430*a*, or from external circuitry such as BIST circuitry 454 or external automated test equipment. In some cases, the diverse architecture among embedded memories $M_1$, $M_2$, $M_3$ may be reflected in differing logical bit widths for the data read from those memories. As such, exclusive-OR function 22*a* in this embodiment is constructed to have sufficient data width to process the widest possible data word. In this example, memory $M_3$ provides the widest logical word width lw3 among embedded memories $M_1$, $M_2$, $M_3$, and as such the bus width from processor core 430 *a* to exclusive-OR function 22*a*, as well as the data width of the output of exclusive-OR function 22*a* itself, are at least at this logical word width lw3.

As described above, exclusive-OR function 22*a* performs a bit-wise comparison of the memory output communicated from the one of the embedded memories $M_1$, $M_2$, $M_3$ of processor core 430 *a* under test, with the expected data for corresponding addresses of that memory as generated by the applicable test circuitry, to provide a fail signature indicating which bits of the output data, if any, fail the test by not matching the corresponding bits of expected data. According to this architecture, the fail signature presented by exclusive-OR function 22*a* at any given time may come from any one of the embedded memories $M_1$, $M_2$, $M_3$ of processor core 430*a*. As such, decode memory physical map function 24*a* is provided to decode the fail signature according to which of memories $M_1$, $M_2$, $M_3$ it belongs. In this example, decode memory physical map function 24*a* carries out this decoding by bit-wise AND functions $52_1$ through $52_3$. Each bit of AND functions $52_1$ through $52_3$ receives a corresponding fail signature bit at one input, and an identifier (M1, M2, M3, respectively) indicating which of the embedded memories $M_1$, $M_2$, $M_3$ is currently being accessed. Accordingly, only the one of AND functions $52_1$ through $52_3$ that is associated with the memory currently under test will pass its fail signature data through to the remainder of the repair analysis. According to this embodiment, the bit width of AND functions $52_1$ through $52_3$ may thus vary according to the logical word width of its corresponding memory $M_1$, $M_2$, $M_3$, respectively, to save chip area. As shown in FIG. 5, AND function $55_1$ has a logical width lw1 corresponding to that of memory $M_1$, AND function $55_2$ has a logical width lw2 corresponding to that of memory $M_2$, AND function $55_3$ has the widest logical width lw3, corresponding to that of memory $M_3$.

While AND functions $52_1$ through $52_3$ decode the fail signature data from exclusive-OR function 22*a* according to the currently accessed memory, multiplexer mapping functions $54_1$, $54_2$, $54_3$ of memory decode physical map function 22*a* map the fail signature data from the logical architecture of embedded memories $M_1$, $M_2$, $M_3$ to a physical view corresponding to the physical repair architecture of the particular embedded memory, on which the repair analysis can be performed. It is contemplated that those skilled in the art having reference to this specification can implement the particular arrangement of multiplexer mapping functions $54_1$, $54_2$, $54_3$ appropriate for the specific architectures of the embedded memories, in the conventional manner. The resulting physical-aware fail signature data produced by multiplexer mapping functions $54_1$, $54_2$, $54_3$ are provided to align and merge function 32, at physical word widths w1, w2, w3, respectively.

According to these embodiments, align and merge function 32 transforms the physical-aware fail signature data from decode memory physical map function 24*a* into a unified repair format on which centralized repair analysis and fuse encoding are performed by BIRA circuitry 40. In the particular architecture shown in FIG. 5, align and merge function 32 accomplishes this alignment and merging by splitting the fail signature data from decode memory physical map function 24*a* at boundaries between repair entities, and placing those data within a unified repair format. The unified repair format is arranged according to a super-set of the repair entities over the associated embedded memories for this processor core, such that the format is sufficient to encode a fuse pattern for the memory with the most complex repair architecture (i.e., largest number of repair entities, and longest corresponding fuse signature). Additional bits of the unified repair format are padded (e.g., with "0") for those memories having less complex repair architectures (i.e., fewer repair entities, or shorter fuse signatures).

The architecture of FIG. 5 will be described for an example in which embedded memory $M_1$ of processor core 430*a* has one repair entity (e.g., a redundant column as indicated by its column repair address (CRA) register), and embedded memories $M_2$ and $M_3$ have two available repair entities (e.g., each with a redundant column as indicated by its CRA register, and a redundant row as indicated by its row repair address (RRA) register), with physical word width w3 being wider than physical word width w2. As such, the unified repair format in this example will contemplate two repair entities, with the width of the fail signature data being at least as large as physical word width w3. In this embodiment, align and merge function 32 is constructed to include alignment function $56_x$ for each memory, that splits the fail signature data from function 24*a* into portions corresponding to the number of available repair entities for its memory $M_x$, and register stages 60 that receive the split portions of fail signature data and apply it to the appropriate centralized fuse encoders 64. In this example, since memory $M_1$ has only one repair entity, alignment function $56_1$ does not "split" the fail signature data from function 24*a*, but applies it to register stage $60b_1$ for its repair entity, padding any excess bit positions of register stage $60b_1$ and the entirety of register stage $60a_1$ with "0" data. Alignment function $56_2$ splits the fail signature data for memory $M_2$ from multiplexed mapping function $54_2$ into two portions at the repair entity boundary (e.g., the midpoint of the fail signature data), and applies one portion to register stage $60a_2$ for one of the repair entities and the other portion to register stage $60b_2$ for the other repair entity; any excess bit positions of register stages $60a_2$, $60b_2$ are filled with "0" data. The fail signature data for memory $M_3$ are also center-decoded, such that alignment function $56_3$ applies one portion of the fail signature data from multiplexer mapping function $54_3$ to register stage $60a_3$ for one of the repair entities, and applies the other portion to register stage $60b_3$ for the other repair entity, padding any excess bit positions with "0" data. In this example, because the upper portion of the fail signature data for memory $M_3$ is associated with the lower repair entity and register stage $60b_3$ and the lower portion of the fail signature data is associated with the upper repair entity and register stage $60a_3$, align and merge function 24 swaps the position of these fail signature data portions as shown in FIG. 5.

The aligned decoded fail signature data are then merged by OR functions 62a, 62b for application to the available repair entities. In this example, OR function 62a receives the contents of upper register stages $60a_1$, $60a_2$, $60a_3$, one of which will typically include fail signature data from the memory under test and the others of which will include "0" data in this example, and will forward that data to fuse encoder 64a. Conversely, OR function 62b receives the contents of lower register stages $60b_1$, $60b_2$, $60b_3$, only one of which will typically include fail signature data at any given time, and will forward that data to fuse encoder 64b.

According to this embodiment, BIRA circuitry 40 includes one or more fuse encoders 64, each of which can be used for any one of the embedded memories of a given processor core 430. The number of fuse encoders 64 corresponds to the maximum number of repair entities for an embedded memory in that processor core 430. For the example of FIG. 5, the maximum number of repair entities among embedded memories $M_1$, $M_2$, $M_3$ of processor core 430a is two (i.e., for memories $M_2$, $M_3$). As such, two fuse encoders 64a, 64b are provided in this instance of BIRA circuitry 40 for processor core 430a.

Each fuse encoder 64a, 64b is constructed of logic circuitry arranged in the conventional manner for encoding fail signature data for a memory into a fuse pattern that enables one of the repair entities for that memory. For example, if the two repair entities for a memory are redundant columns, the fail signature data will indicate the column address in which a read failure occurs, and thus the column address for which a redundant column is to be included in the function of the memory. However, because the fail signature data presented to fuse encoders 64a, 64b are arranged in a unified repair format, fuse encoders 64a, 64b are each capable of encoding the fuse pattern for each of multiple embedded memories, regardless of the particular architectures of those memories.

In the architecture of FIG. 5, fuse encoders 64a, 64b present the encoded fuse patterns for the corresponding repair entities to fuse reconfiguration logic 44. Fuse reconfiguration logic 44 reconfigures the fuse patterns from the unified repair format into the arrangement applicable to the memory to which the fuse pattern pertains.

Figure 6:
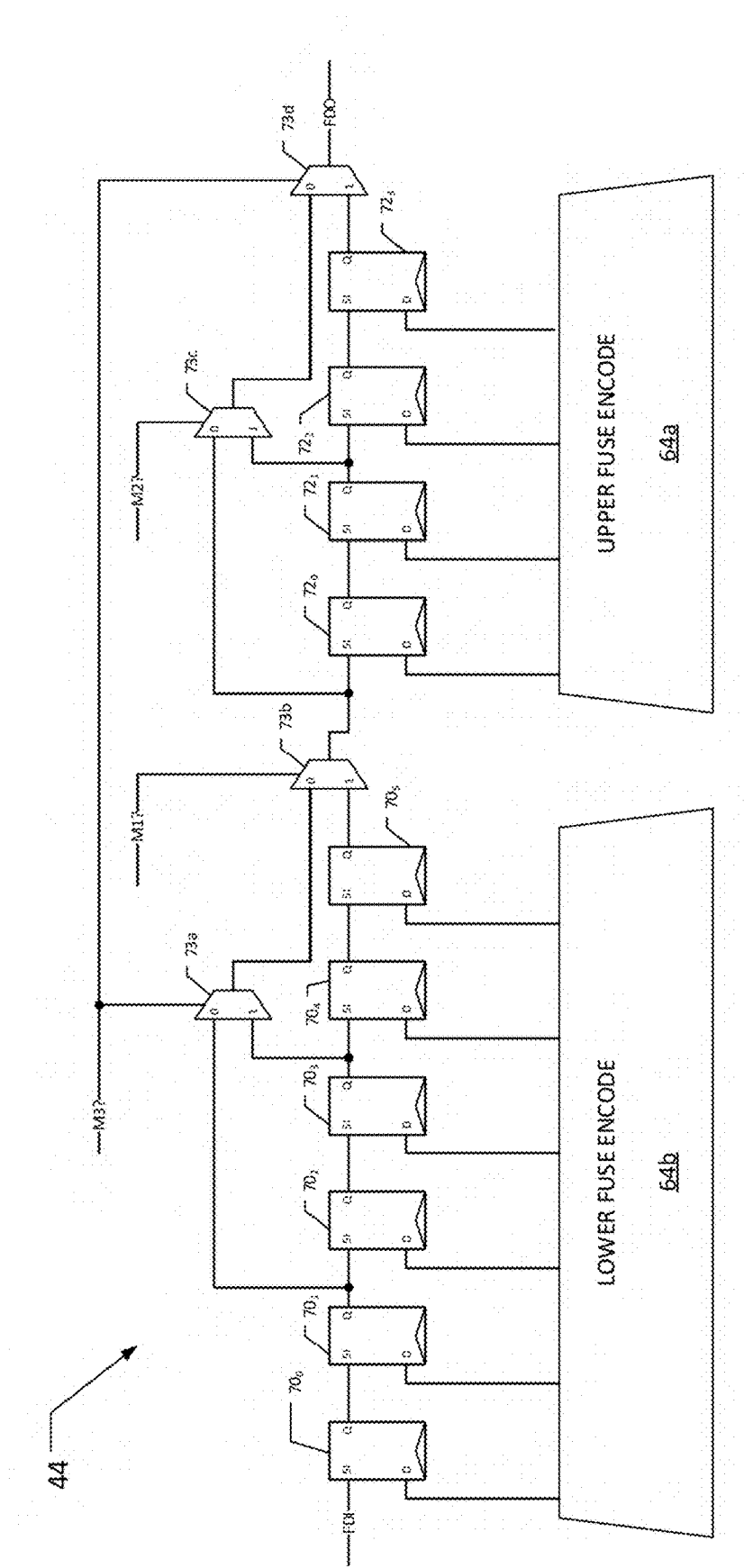
FIG. 6 is an electrical diagram, in block form, of fuse reconfiguration logic in the architecture of FIG. 5 according to that embodiment.

In this embodiment, fuse reconfiguration logic 44 is constructed as a series of latches associated with each fuse encoder 64, in combination with multiplexers that selectively route data stored in those latches according to an identifier of the memory currently under test. The number of latches in each series corresponds to the number of bit positions in the unified repair format, which is defined by the maximum number of bits of the fuse pattern for an associated repair entity, as will be evident from an example of fuse reconfiguration logic 44 shown in FIG. 6 for the case of processor core 430a described above, which includes three embedded memories $M_1$, $M_2$, $M_3$.

In this example, embedded memory $M_1$ has one repair entity for which the fuse pattern consists of six bits, embedded memory $M_2$ has two repair entities with fuse patterns of two bits each, and embedded memory $M_3$ has two repair entities with fuse patterns of four bits each. The unified repair architecture for processor core 430a as implemented by BIRA circuitry 40 must be capable of producing a fuse pattern sufficient for all of embedded memories $M_1$, $M_2$, $M_3$. Accordingly, given this repair architecture, the unified repair architecture for processor core 430a requires two fuse encoders 64a, 64b (for the maximum number of repair entities of two), one generating a fuse pattern of six bits and the other generating a fuse pattern of four bits. As mentioned above, for those memories for which the fuse pattern is smaller than that allowed by the unified repair format, align and merge function 32 and fuse encoders 64 will "pad" the excess bit positions with "0" data (or other "don't care" values) as placeholders in those bit positions. One may tabulate the unified repair format as utilized by these embedded memories $M_1$, $M_2$, $M_3$ as follows:

| | Unified Repair Format for Processor Core 430a | | | | | | | | | |
|---|---|---|---|---|---|---|---|---|---|---|
| | Lower Fuse Encoder | | | | | | Upper Fuse Encoder | | | |
| $M_1$ | D | D | D | D | D | D | 0 | 0 | 0 | 0 |
| $M_2$ | D | D | 0 | 0 | 0 | 0 | D | D | 0 | 0 |
| $M_3$ | D | D | D | D | 0 | 0 | D | D | D | D | where "D" indicates that the fuse pattern for that memory will include a data bit, and where "0" in the table indicates an excess bit position that is padded with the "0" (i.e., "don't care") value for that memory. The example of fuse reconfiguration logic 44 shown in FIG. 6 implements this encoding of the fuse patterns within that unified repair format, with two series of latches for the two fuse encoders 64a, 64b of BIRA circuitry 40. One series of six latches $70_0$ through $70_5$ receives a fuse pattern from lower fuse encoder 64b, and the other series of four latches $72_0$ through $72_3$ receives a fuse pattern from upper fuse encode 64a. These latches 70, 72 are connected in series, such that upon the application of a series of clock pulses to the latch clock inputs (the clock lines not shown in FIG. 6), their contents are shifted in sequence and serially read out at serial output FDO. In this embodiment, dummy data are shifted into the series of latches at latch $70_0$ at line FDI (e.g., line FDI may be hard-wired to a logic level). More specifically, each of latches $70_0$ through $70_5$ receives a corresponding data bit of the fuse pattern from lower fuse encoder 64b at a D input, and each of latches $72_0$ through $72_3$ receives a corresponding data bit of the fuse pattern from upper fuse encoder 64a at its D input. Each of latches 70, 72 also has a serial input SI, an output Q, and a clock input. In this example, the SI input of latch $70_0$ receives an external value on line FDI, and the Q outputs of latches $70_0$ through $70_4$ are connected directly to the SI input of the next latch $70_1$ through $70_5$, respectively, in that series. Similarly, the Q output of each of latches $72_0$ through $72_2$ is connected to the SI input of the corresponding next latch $72_1$ through $72_4$, respectively.

Multiplexers 73a through 73d in fuse reconfiguration logic 44 implement the serial communication of fuse pattern data for each of the embedded memories $M_1$, $M_2$, $M_3$, as will now be described. In this example, multiplexer 73a receives the Q output of latch $70_1$ at its "0" (or "false") input, the Q output of latch $70_3$ at its "1" (or "true") input, and an indicator that memory $M_3$ is selected at its control input. Multiplexer 73b receives the output of multiplexer 73a at its "0" input, the Q output of latch $70_5$ at its "1" input, and an indicator that memory $M_1$ is selected at its control input. Multiplexer 73c receives the output of multiplexer 73b at its "0" input, the Q output of latch $72_1$ at its "1" input, and an indicator that memory $M_2$ is selected at its control input. Multiplexer 73d receives the output of multiplexer 73c at its "0" input, the Q output of latch $72_3$ at its "1" input, and the indicator that memory $M_3$ is selected at its control input. It is contemplated that the indicators of which memory is selected will be generated by the applicable BIST embedded circuitry, or other internal or external test circuitry, to identify which memory is currently under test. As a result, the fuse pattern data in the unified repair format, as generated by upper and lower fuse encoders 64a, 64b, are loaded in parallel into the latches 70, 72 of fuse reconfiguration logic 44, and are serially clocked out on line FDO in a format that corresponds to the shadow fuse register 46 (FIG. 4) for the current embedded memory under test.

Figure 7A:
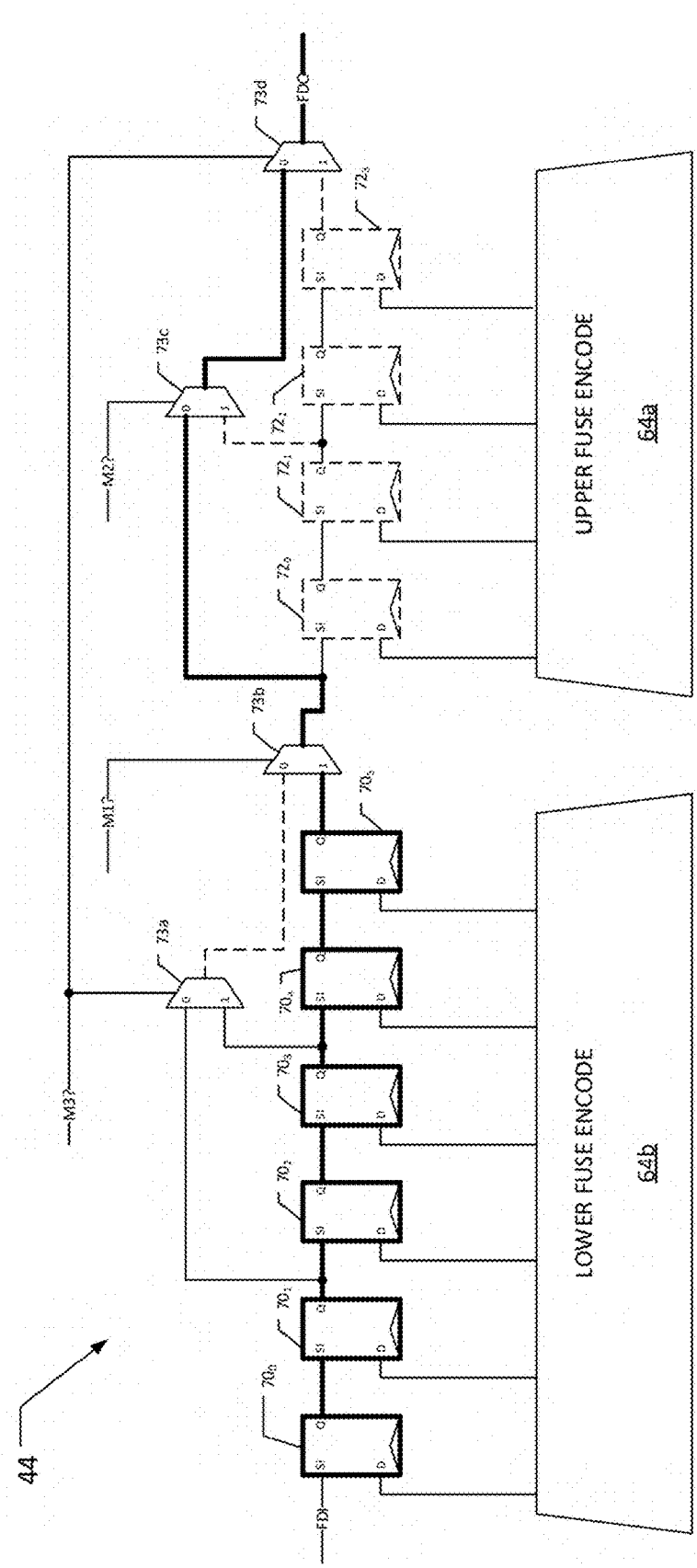
FIGS. 7a through 7c are electrical diagrams, in block form, of the operation of the fuse reconfiguration logic of FIG. 6 as applied to each of three embedded memory architectures, according to that embodiment.
Figure 7B:
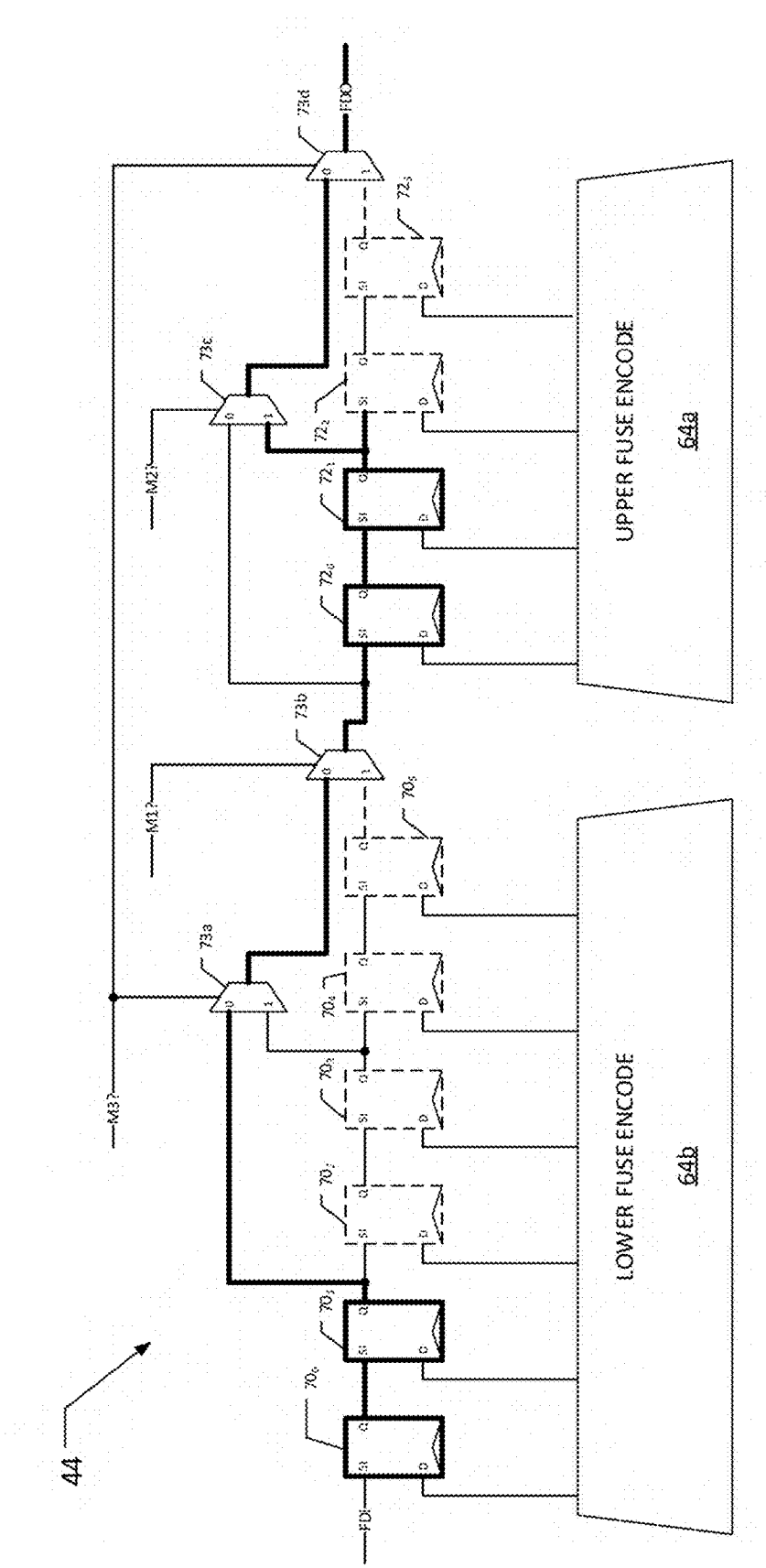
Figure 7C:
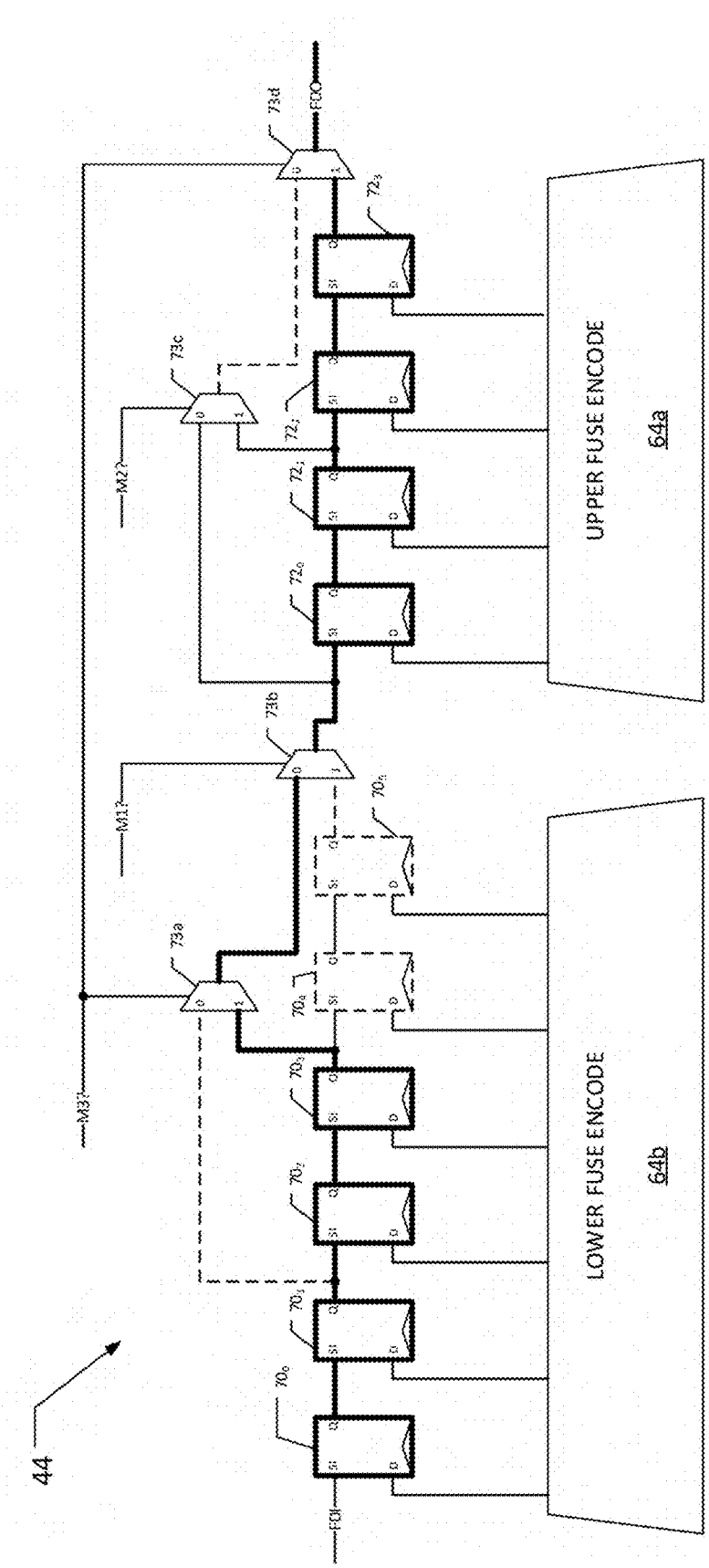

FIGS. 7a through 7c illustrate the operation of fuse reconfiguration logic 44 for the selections of embedded memories $M_1$, $M_2$, $M_3$, respectively. FIG. 7a illustrates the data path for the case in which memory $M_1$ is the memory under test, such that the fuse pattern consists of six bits for a single repair entity. As described above relative to FIG. 5, merge and align function 32 applied the fail signature data only to lower register stage $60b_1$, with upper register stage $60a_1$ being padded with "0" data values. As such, only lower fuse encoder 64b is operating on actual fail signature data when memory $M_1$ is the memory under test, and only latches $70_0$ through $70_5$ associated with lower fuse encoder 64b will receive valid encoded fuse pattern data, as indicated by the bold highlighting in FIG. 7a. The data loaded into latches $72_0$ through $72_3$ from upper fuse encoder 64a will be ignored, as indicated by the dashed representation. In other words, multiplexers 73b, 73c, 73d will route the fuse pattern data from latches $70_0$ through $70_5$ to output FDO, bypassing latches $72_0$ through $72_3$. In operation, therefore, the encoded fuse pattern data from lower fuse encoder 64b are loaded, in parallel, into latches $70_0$ through $70_5$; the padded "0" values from upper fuse encoder 64a are also loaded into latches $72_0$ through $72_3$ at the same time. A sequence of clock pulses (not shown) are then applied to latches 70, 72, causing the contents of latches $70_0$ through $70_5$ to be shifted out from output FDO in reverse order, for application to the shadow fuse register 46 associated with memory $M_1$.

For the case in which memory $M_2$ is the memory under test, multiplexers 73 of fuse reconfiguration logic 44 will route the fuse pattern data in the manner shown in FIG. 7b. Two repair entities are available for memory $M_2$, as described above, and as such fuse pattern data encoded by both of upper and lower fuse encoders 64a, 64b (two bits for each) are to be forwarded to the corresponding shadow fuse register 46. Accordingly, as shown in FIG. 7b for this case, multiplexers 73a and 73b operate to route the Q output of latch $70_1$ to the SI input of latch $72_0$, bypassing latches $70_2$ through $70_5$; similarly, multiplexers 73c and 73d route the Q output of latch $72_1$ to output FDO, bypassing latches $72_2$ and $72_3$. Accordingly, after the parallel loading of fuse pattern data from fuse encoders 64a, 64b into latches $70_0$, $70_1$, $72_0$, $72_1$ (and loading the padded "0" values into the other latches), these four bits of fuse pattern data are then serially read out at output FDO by the application of four clock pulses to latches 70, 72.

FIG. 7c similarly shows the routing of fuse pattern data in fuse reconfiguration logic 44 for the case of memory $M_3$ as the memory under test. As described above, memory $M_3$ has two repair entities, each enabled by a four-bit fuse pattern. In this example, multiplexers 73a and 73b operate to route the Q output of latch $70_3$ to the SI input of latch $72_0$, bypassing latches $70_4$ and $70_5$, and multiplexer 73d routes the Q output of latch $72_3$ to output FDO. In operation, the fuse pattern data from fuse encoders 64a, 64b are loaded in parallel into latches $70_0$ through $70_3$ and $72_0$ through $72_3$ (with padded "0" values loaded into latches $70_4$ and $70_5$), and are serially read out from output FDO by the application of eight clock pulses to latches 70, 72.

Figure 8:
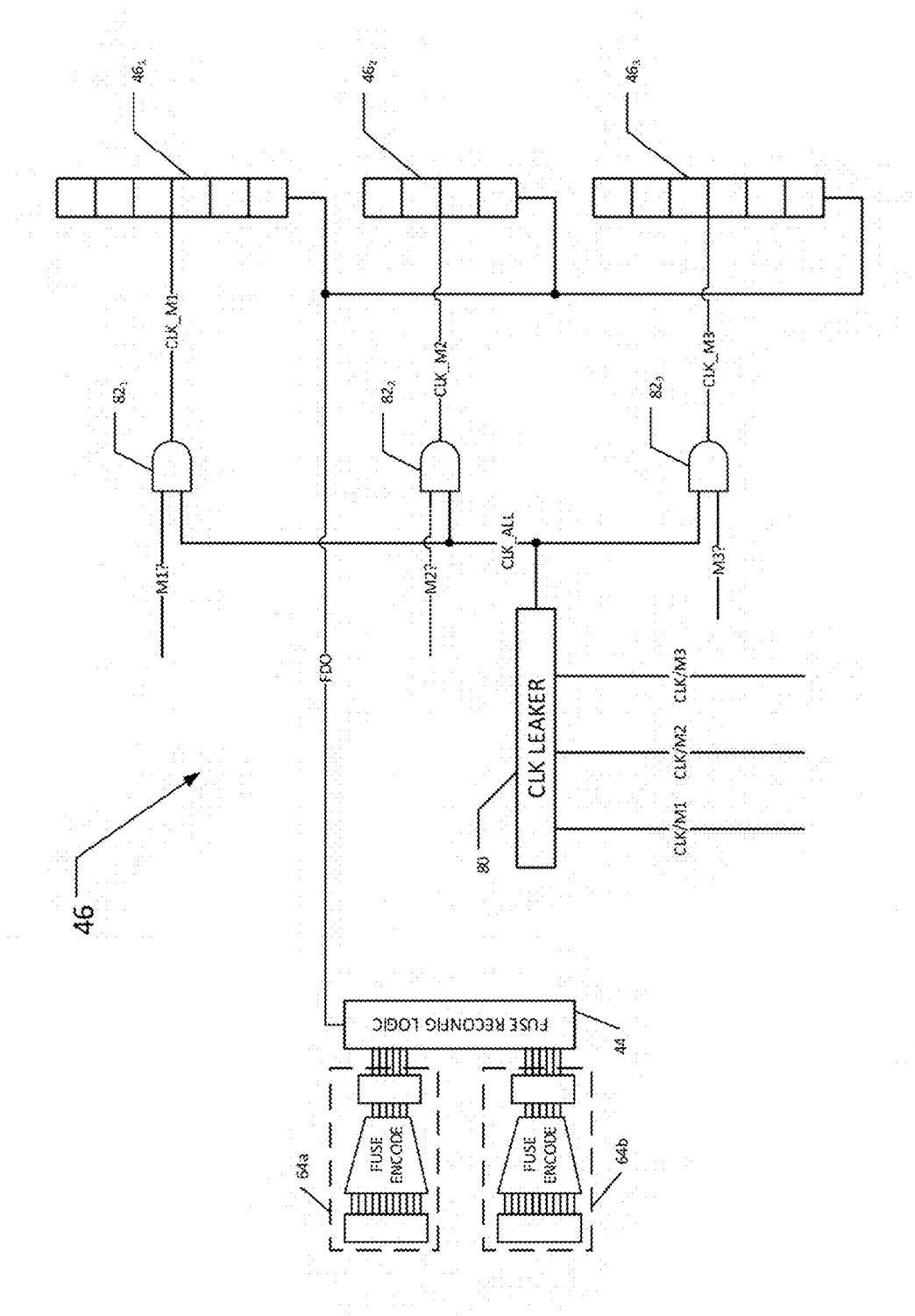
FIG. 8 is an electrical diagram, in block form, of shadow fuse registers and associated logic circuitry in the architecture of FIG. 5 according to an embodiment.

FIG. 8 illustrates the architecture of shadow fuse registers 46 for the example described above relative to FIGS. 6 and 7a through 7c, according to an embodiment. In this example, the output FDO from fuse reconfiguration logic 44 is applied in parallel to shadow fuse registers $46_1$, $46_2$, $46_3$ for memories $M_1$, $M_2$, $M_3$, respectively, of processor core 430a. Shadow fuse registers $46_1$, $46_2$, $46_3$ are selectively enabled by clock signals CLK_M1, CLK_M2, CLK_M3, respectively, as issued by corresponding clock gates $82_1$, $82_2$, $82_3$, such that only the shadow fuse register 46 for the current memory under test receives updated fuse pattern data from fuse reconfiguration logic 44, while the other shadow fuse registers 46 retain their previous contents. In this embodiment, clock leaker function 80 receives clock signals CLK/M1, CLK/M2, and CLK/M3 as applied to memories $M_1$, $M_2$, $M_3$, respectively, and combines these clock signals into a single clock signal CLK_ALL that is applied to an input of each of clock gates $82_1$, $82_2$, $82_3$. Another input of clock gate $82_1$ receives indicator signal M1 corresponding to memory $M_1$ being selected; similarly, clock gates $82_2$ and $82_3$ receive signals $M_2$, $M_3$, respectively, indicating selection of their respective embedded memories $M_2$, $M_3$. As such, the one of clock gates $82_1$, $82_2$, $82_3$ receiving a positive indicator that its memory is the currently selected memory under test will pass clock signal CLK_ALL as its output clock signal CLK_M1, CLK_M2, CLK_M3, allowing its corresponding shadow fuse register $46_1$, $46_2$, $46_3$ to receive the fuse pattern data that is serially presented at line FDO.

Referring back to FIGS. 3 and 4, upon the storing of the fuse pattern in shadow fuse registers 46, those fuse pattern data can be communicated from shadow fuse registers 46 to the corresponding embedded memories within the various processor cores 430, as well as for the non-embedded memories 410a, 410b, 411 if desired. According to the embodiment of FIG. 5, for example, shadow fuse registers 46 are serially scanned out in the manner of a single shift register, under the control of scan clock circuitry 47, for storage of the fuse pattern data in the corresponding repair address registers of the associated embedded memories, as conventional in the art. Alternatively or in addition, the contents of shadow fuse registers 46 can be similarly scanned out to fuse controller 451, which in turn programs the corresponding "hard" repair fuses in FuseROM 452 with the redundancy repair information suitable for the corresponding memories. Typically, this "hard" repair operation will be performed at a manufacturing test, rather than as part of a BIST sequence on power-up. For those devices in which "hybrid" repair is performed, to the extent that additional repair entities are invoked during power-up BIST sequences due to additional failing cells occurring over the operating life of the device, those "soft" repair fuse patterns then stored in shadow fuse registers 46 may be scanned out to their corresponding embedded memories for repair over the duration of that power-on interval.

Figure 9:
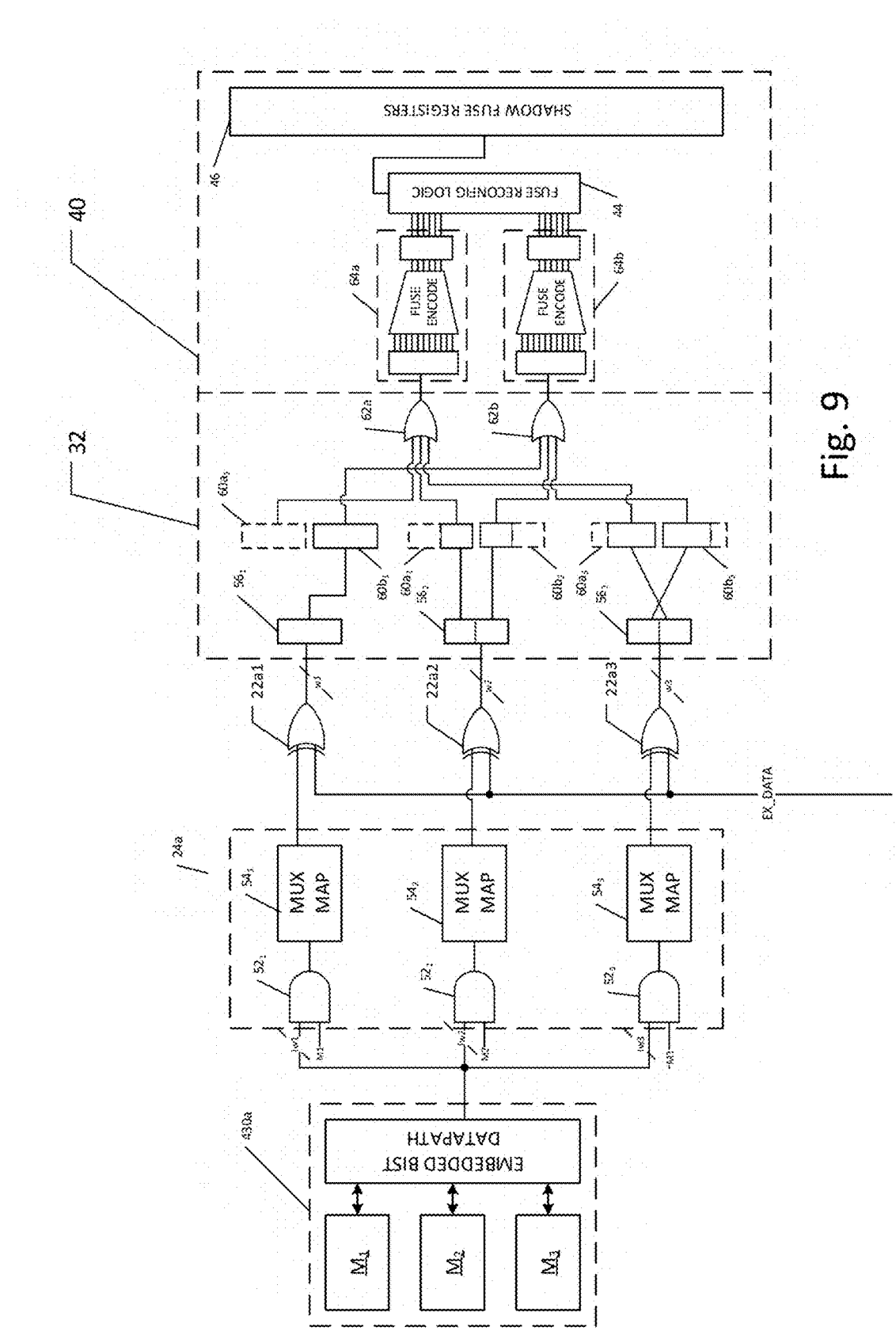
FIG. 9 is an electrical diagram, in block form, of the decode memory physical map and align-and-merge circuitry in the built-in self-repair circuitry of FIG. 4 according to another embodiment.

FIG. 9 illustrates the construction of a portion of BISR circuitry 450 associated with processor core 430a and its embedded memories $M_1$, $M_2$, $M_3$, according to an alternative embodiment from that described above relative to FIG. 5. As before, this portion of BISR circuitry 450 shown in FIG. 9 can be representative of similar circuitry in BISR circuitry 450 associated with other processor cores 430, but is not necessarily the same. For example, other processor cores 430 may be associated with BISR circuitry 450 in the form shown in FIG. 5.

In the embodiment of FIG. 9, physical map decoding is performed on the data as received from the memory under test, rather than on the fail signature following comparison with the expected data. As such, the functional datapath from processor core 430a is applied directly to decode memory physical map function 24a for the three memories $M_1$, $M_2$, $M_3$, rather than to an exclusive-OR function for comparison with the expected data from BIST circuitry 454. The logical bit width of the functional datapath from processor core 430a is at least as wide as the widest logical bit width of the three memories, which in this case is the logical bit width lw3 of memory $M_3$. AND functions $52_1$ through $52_3$ of decode memory physical map function 24a receive the data from the datapath of processor core 430a at one input, and an identifier (M1, M2, M3, respectively) indicating which of the embedded memories $M_1$, $M_2$, $M_3$ is currently being accessed. Accordingly, only the one of AND functions $52_1$, $52_2$, $52_3$ that is associated with the memory under test will pass its memory data forward to its corresponding multiplexer mapping function $54_1$, $54_2$, $54_3$, which will in turn map the memory data from the logical architecture of its embedded memory $M_1$, $M_2$, $M_3$ to a physical architecture on which the repair analysis can be performed, according to a physical view corresponding to the physical repair architecture of the particular embedded memory.

According to this embodiment, multiplexer mapping functions $54_1$, $54_2$, $54_3$ thus present the memory data from their respective memories $M_1$, $M_2$, $M_3$, in a physical-aware form, to an input of a corresponding exclusive-OR function 22a1, 22a2, 22a3, respectively. Each of exclusive-OR functions 22a1, 22a2, 22a3 also receive, at another input, the expected data as generated by BIST circuitry 454 or external automated test equipment for the particular test being performed. These expected data are similarly arranged in a physical-aware form, matching that of the expected data presented by decode memory physical map function 24a for the intended one of memories $M_1$, $M_2$, $M_3$, so that the proper comparison may be made. The provision of dedicated exclusive-OR functions 22a1, 22a2, 22a3 for each memory $M_1$, $M_2$, $M_3$ allows these functions to have a bit width matching that of its memory, rather than a bit width corresponding to the widest bit width among the memories. The exclusive-OR function 22a1, 22a2, 22a3 associated with the memory currently under test will thus generate fail signature data indicating the bit positions at which the decoded and mapped memory data from decode memory physical map function 24a do not match the expected data for that test. These fail signature data for embedded memories $M_1$, $M_2$, $M_3$ are then presented to align and merge function 32, which transforms the physical-aware fail signature data into a unified repair format upon which centralized repair analysis and fuse encoding is applied by BIRA circuitry 40, as described above relative to FIGS. 5, 6, and 7a through 7c.

These embodiments provide important advantages relative to conventional BISR circuitry, particularly in large-scale integrated circuits such as SoC devices. As discussed above, conventional BISR circuitry provides a dedicated fuse encoder for each embedded memory in each processor core, because of differences in the repair architectures among those various memories. According to these embodiments, however, the same fuse encoder circuitry can be used for multiple embedded memories of varying repair architectures, regardless of whether the embedded memories are directly accessible or are embedded within a "black box" processor core that has its own embedded BIST circuitry datapath. By reducing the number of instances of fuse encoders required in the integrated circuit, these embodiments can save substantial chip area relative to conventional BISR implementations, for example by as much as 50% over state-of-the-art EDA self-repair solutions for processor cores with embedded BIST. In addition, it is contemplated that these embodiments can save substantial memory repair test time and power consumption, as compared with conventional large-scale integrated circuit architectures in which "black box" processor cores with embedded BIST cannot take advantage of built-in repair techniques.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit, comprising:
   a first processor core, comprising:
     logic circuitry;
     a plurality of embedded memories, each associated with at least one repair entity; and
     built-in self-test circuitry; and
   built-in self-repair circuitry, comprising:
     a first decode function, having an input coupled to the first processor core, for decoding test data from each of the embedded memories into fail signature data in a physical-aware format for the associated memory;
     align and merge circuitry, for reformatting the fail signature data from the first decode function into a unified repair format for all of the plurality of embedded memories of the first processor core;
     one or more fuse encoders, having an input coupled to the align and merge circuitry, each for generating a fuse pattern in the unified repair format for a repair entity;
     fuse reconfiguration logic, for reconfiguring the fuse patterns generated by the one or more fuse encoders from the unified repair format into a fuse pattern having an order corresponding to one or more of the repair entities for a selected one of the plurality of embedded memories; and
     a plurality of shadow fuse registers, each having an input coupled to the fuse reconfiguration logic, each for storing a fuse pattern for the repair entities of an associated embedded memory.

2. The integrated circuit of claim 1, wherein the unified repair format for the first processor core includes a plurality of portions numbering at least the maximum number of repair entities among the plurality of embedded memories of the first processor core, each portion including a plurality of bit positions numbering at least the maximum number of bits of the fail signature data in the physical-aware format for the corresponding repair entity among the plurality of embedded memories of the first processor core.

3. The integrated circuit of claim 2, wherein the align and merge circuitry comprises:

a plurality of alignment functions, each associated with one of the plurality of embedded memories, for splitting the physical-aware fail signature data into a plurality of portions corresponding to the unified repair format;

for each of the plurality of alignment functions, a plurality of register stages, each register stage corresponding to one of the portions of the unified repair format, and storing the corresponding portion of the physical-aware fail signature data; and merge circuitry, for merging the contents of one register stage for each of the plurality of embedded memories for application to a corresponding fuse encoder.

4. The integrated circuit of claim 3, wherein the plurality of alignment functions each pad excess bit positions in the portions of physical-aware fail signature data beyond that required for enabling the corresponding repair entity for its associated memory.

5. The integrated circuit of claim 1, wherein the first decode function comprises:

comparison circuitry for comparing the test data from each of the embedded memories with expected data for that memory to produce fail signature data; and a plurality of multiplexer mapping circuits, each associated with one of the plurality of embedded memories, each for mapping the fail signature data for the associated memory into the physical aware format for that memory.

6. The integrated circuit of claim 5, wherein the comparison circuitry produces the fail signature for each of the embedded memories at a common output;

and further comprising:

a plurality of decode circuits, each associated with one of the plurality of embedded memories, having an input coupled to the common output of the comparison circuitry and an input receiving an indicator that the current fail signature data corresponds to its embedded memory, for communicating the fail signature data to the multiplexer mapping circuit associated with its embedded memory responsive to the indicator indicating that the fail signature data corresponds to its embedded memory.

7. The integrated circuit of claim 1, wherein the first decode function comprises:

a plurality of decode circuits, each associated with one of the plurality of embedded memories, having an input coupled to the first processor core and an input receiving an indicator that the current test data corresponds to its embedded memory, and having an output;

a plurality of multiplexer mapping circuits, each associated with one of the plurality of embedded memories and having an input coupled to the output of a corresponding decode circuit, each multiplexer mapping circuit for mapping the test data for the associated memory into the physical-aware format for that memory; and a plurality of comparison circuits, each for comparing the test data from one of the embedded memories as received from a corresponding multiplexer mapping circuit with expected data for that memory to produce fail signature data for that memory.

8. The integrated circuit of claim 1, further comprising:
a second processor core, comprising:
logic circuitry;
a plurality of embedded memories, each associated with at least one repair entity; and
built-in self-test circuitry; and wherein the built-in self-repair circuitry further comprises:
a second decode function, having an input coupled to the first processor core, for decoding test data from each of the embedded memories into fail signature data in a physical-aware format for the associated memory;

wherein the align and merge circuitry is also for reformatting the fail signature data from the second decode function into the unified repair format;

and wherein the unified repair format including a plurality of portions numbering at least the maximum number of repair entities among the plurality of embedded memories of the first and second processor cores, each portion including a plurality of bit positions numbering at least the maximum number of bits of the fail signature data in the physical-aware format for the corresponding repair entity among the plurality of embedded memories of the first and second processor cores.

9. The integrated circuit of claim 1, further comprising:
a fuse non-volatile read-only-memory, for storing fuse pattern data for each of the repair entities for each of the embedded memories; and
a fuse controller, for writing contents of the shadow fuse register for one or more of the embedded memories into corresponding locations of the fuse non-volatile read-only-memory.

10. The integrated circuit of claim 1, further comprising:
circuitry for communicating the fuse pattern data stored in at least one of the shadow fuse registers to its associated embedded memory.

11. A method of executing built-in self-repair functionality in an integrated circuit, comprising:

executing a built-in self-test routine within a first processor core of the integrated circuit, the first processor core comprising a plurality of embedded memories, each memory associated with at least one repair entity;

communicating test data from the built-in self-test routine for one of the plurality of embedded memories to built-in self-repair circuitry in the integrated circuit;

decoding the test data into fail signature data in a physical-aware format for the embedded memory;

reformatting the fail signature data into a unified repair format for the first processor core, the unified repair format including a plurality of portions numbering at least the maximum number of repair entities among the plurality of embedded memories of the first processor core, each portion including a plurality of bit positions numbering at least the maximum number of bits of the fail signature data in the physical-aware format for the corresponding repair entity among the plurality of embedded memories of the first processor core;

encoding the fail signature in the unified repair format into a fuse pattern, in the unified repair format, for the repair entities of the embedded memory;

reconfiguring the fuse pattern from the unified repair format into a fuse pattern having an order corresponding to the repair entities for the embedded memory; and then storing the reconfigured fuse pattern in one or more shadow fuse registers associated with the embedded memory.

12. The method of claim 11, wherein the reformatting step comprises:
- splitting the physical-aware fail signature data into a plurality of portions corresponding to the unified repair format;
- storing the corresponding portion of the physical-aware fail signature data in a plurality of register stages, each register stage corresponding to one of the portions of the unified repair format; and
- merging the contents of one register stage for each of the plurality of embedded memories for application to a corresponding fuse encoder.

13. The method of claim 12, wherein the reformatting step further comprises:
- padding excess bit positions in the portions of physical-aware fail signature data beyond that required for enabling the corresponding repair entity.

14. The method of claim 11, wherein the decoding step comprises:
- comparing the test data for the embedded memory with expected data for that memory to produce the fail signature data; and
- mapping the fail signature data for the embedded memory into the physical-aware format for that memory.

15. The method of claim 11, wherein the decoding step comprises:
- mapping the test data for the associated memory into the physical-aware format for that memory; and
- then comparing the test data from the embedded memory with expected data for that memory to produce the fail signature data.

16. The method of claim 11, further comprising:
- writing contents of the shadow fuse register for the embedded memory into a fuse non-volatile read-only-memory.

17. The method of claim 11, further comprising:
- storing contents of a shadow fuse register in a repair address register of its associated embedded memory.

* * * * *